(12) United States Patent
Fujimura et al.

(10) Patent No.: US 7,985,514 B2
(45) Date of Patent: Jul. 26, 2011

(54) METHOD FOR FRACTURING A PATTERN FOR WRITING WITH A SHAPED CHARGED PARTICLE BEAM WRITING SYSTEM USING DRAGGED SHOTS

(75) Inventors: Akira Fujimura, Saratoga, CA (US); Harold Robert Zable, Palo Alto, CA (US); Michael Tucker, Los Altos, CA (US)

(73) Assignee: D2S, Inc., San Jose, CA (US)

( * ) Notice: Subject to any disclaimer, the term of this patent is extended or adjusted under 35 U.S.C. 154(b) by 71 days.

(21) Appl. No.: 12/603,580

(22) Filed: Oct. 21, 2009

(65) Prior Publication Data

US 2011/0089344 A1 Apr. 21, 2011

(51) Int. Cl.
  *G03F 9/00* (2006.01)
  *G03F 1/00* (2006.01)
  *G06F 17/50* (2006.01)
(52) U.S. Cl. .............. 430/5; 430/30; 430/296; 430/396; 430/397; 430/942; 716/53; 716/55
(58) Field of Classification Search .............. 430/5, 30, 430/296, 396, 397, 942; 716/53, 55
See application file for complete search history.

(56) References Cited

U.S. PATENT DOCUMENTS

| 5,082,762 | A  | 1/1992  | Takahashi |
| 5,173,582 | A  | 12/1992 | Sakamoto et al. |
| 6,037,601 | A  | 3/2000  | Okunuki |
| 7,176,470 | B1 | 2/2007  | Evans et al. |
| 2002/0042009 | A1 | 4/2002 | Suzuki |
| 2003/0059716 | A1 | 3/2003 | Simizu |
| 2003/0077530 | A1 | 4/2003 | Fujiwara et al. |
| 2004/0011966 | A1 | 1/2004 | Sasaki et al. |
| 2005/0091632 | A1 | 4/2005 | Pierrat et al. |

FOREIGN PATENT DOCUMENTS

| EP | 1429368 A2 | 6/2004 |
| JP | 03205815 A | 9/1991 |
| JP | 2000091191 A | 3/2000 |
| WO | 03036386 | 5/2003 |
| WO | 03036386 A2 | 5/2003 |
| WO | 2010025031 A2 | 3/2010 |
| WO | 2010025061 A2 | 3/2010 |

OTHER PUBLICATIONS

International Search Report and Written Opinion dated Dec. 3, 2010 for PCT/US2010/046559.
International Search Report and Written Opinion dated Dec. 29, 2010 for application PCT/us2010/051534.
U.S. Appl. No. 12/540,328, filed Aug. 12, 2009, titled "Method For Design and Manufacture of a Reticle Using a Two-Dimensional Dosage Map and Charged Particle Beam Lithography", Fujimura et al.
U.S. Appl. No. 61/237,290, filed Aug. 26, 2009, titled "Method and System For Manufacturing a Surface Using Charged Particle Beam Lithography", Hagiwara et al.
U.S. Appl. No. 12/540,321, filed Aug. 12, 2009, titled "Method For Fracturing Circular Patterns and For Manufacturing a Semiconductor Device", Fujimura et al.
U.S. Appl. No. 12/202,366, filed Sep. 1, 2008, titled "Method and System For Design of a Reticle To Be Manufactured Using Character Projection Lithography", Fujimura et al.
Hara, S. et al., "Character Projection EB Data Conversion System Combined with Throughput Analyzer", Japanese Journal of Applied Physics, vol. 33 (1994), pp. 6935-6939, Japan Society of Applied Physics, Kudan-Kita building 5th floor, Kudan-Kita 1-12-3, Chiyoda-ku, Tokyo 102-0073, Japan.
Hattori, K. et al., "Electron Beam Direct Writing System EX-8D Employing Character Projection Exposure Method", Journal of Vacuum Science Technology, vol. B11(6) (1993), pp. 2346-2351, 1993, American Vacuum Society, 125 Maiden Lane, 15th Floor, New York, NY 10038.
Yamada, A. et al., "Variable cell projection as an advance in electron-beam cell projection system", Journal of Vacuum Science Technology, B 22(6) (2004), pp. 2917-2922, American Vacuum Society, 125 Maiden Lane, 15th Floor, New York, NY 10038.
Extended European Search report dated Apr. 28, 2011 for EPO Application No. 10173794.8.
International Search Report and Written Opinion dated May 30, 2011 for International Application No. PCT/US2010/051393.
Nishimura, S. et al., "Development of a mask-scan electron beam mask writer", Journal of Vacuum Science & Technology B (Microelectronics and Nanometer Structures). vol. 20, No. 6, Nov. 1, 2002, pp. 2640-2645 XP002632946.

*Primary Examiner* — Christopher G Young
(74) *Attorney, Agent, or Firm* — The Mueller Law Office, P.C.

(57) ABSTRACT

In the field of semiconductor production using shaped charged particle beam lithography, a method and system for fracturing or mask data preparation or proximity effect correction is disclosed, wherein a shot determined for a shaped charged particle beam writer system comprises dragging the charged particle beam across a surface during the shot, so as to form a complex pattern in a single, extended shot. The dragging may be done with either variable shaped beam (VSB) or character projection (CP) shots. Methods for specifying in the shot data the path for the dragged shot are also disclosed. Other embodiments include using dragged shots with partial projection, varying the dragging velocity during a shot, and combining dragged shots with conventional shots. A method and system for creating glyphs which contain dragged shots is also disclosed.

25 Claims, 11 Drawing Sheets

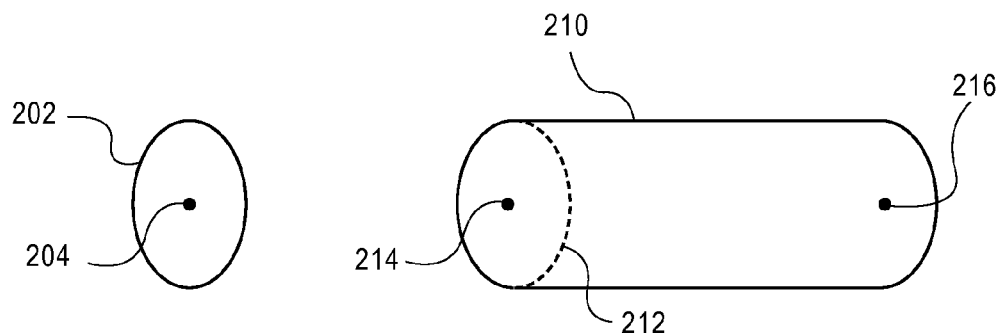
FIG. 2A  FIG. 2B
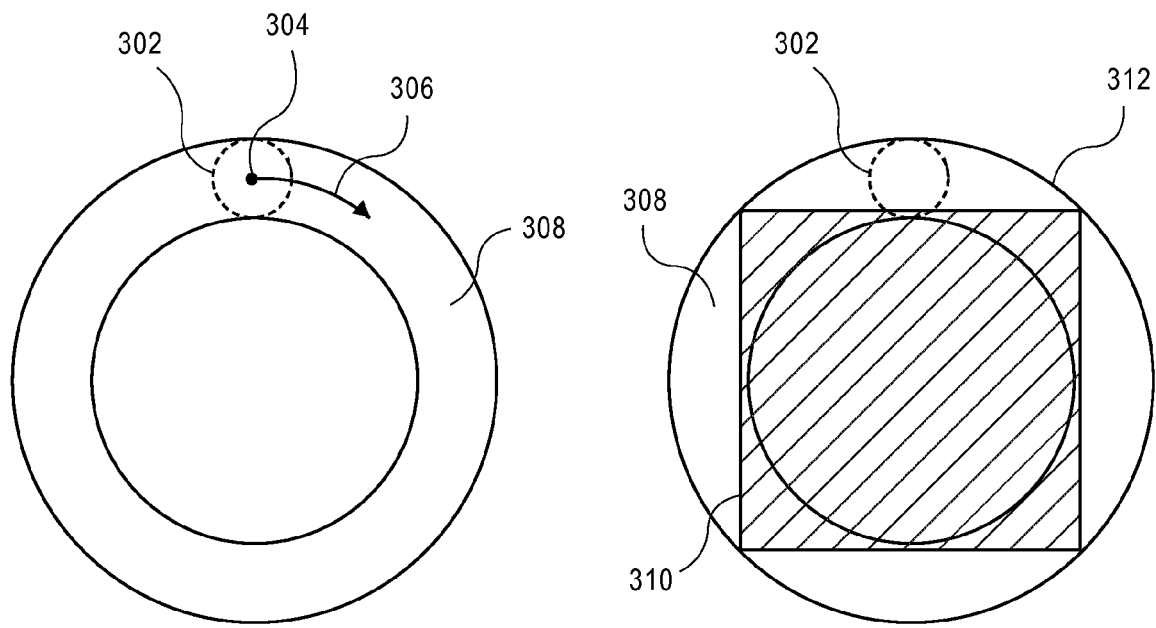
FIG. 3A  FIG. 3B

METHOD FOR FRACTURING A PATTERN FOR WRITING WITH A SHAPED CHARGED PARTICLE BEAM WRITING SYSTEM USING DRAGGED SHOTS

RELATED APPLICATIONS

This application is related to Komagata, U.S. patent application Ser. No. 61/253,847 entitled "Method and System for Manufacturing a Surface By Dragging Characters Using Shaped Charged Particle Beam Lithography", filed on even date herewith and which is hereby incorporated by reference for all purposes.

BACKGROUND OF THE DISCLOSURE

The present disclosure is related to lithography, and more particularly to the design of a shaped beam charged particle beam writer system and methods for using the shaped beam charged particle beam writer system to manufacture a surface which may be a reticle, a wafer, or any other surface.

In the production or manufacturing of semiconductor devices, such as integrated circuits, optical lithography may be used to fabricate the semiconductor devices. Optical lithography is a printing process in which a lithographic mask or photomask manufactured from a reticle is used to transfer patterns to a substrate such as a semiconductor or silicon wafer to create the integrated circuit. Other substrates could include flat panel displays or even other reticles. Also, extreme ultraviolet (EUV) or X-ray lithography are considered types of optical lithography. The reticle or multiple reticles may contain a circuit pattern corresponding to an individual layer of the integrated circuit, and this pattern can be imaged onto a certain area on the substrate that has been coated with a layer of radiation-sensitive material known as photoresist or resist. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Eventually, a combination of multiples of devices or integrated circuits will be present on the substrate. These integrated circuits may then be separated from one another by dicing or sawing and then may be mounted into individual packages. In the more general case, the patterns on the substrate may be used to define artifacts such as display pixels or magnetic recording heads.

In the production or manufacturing of semiconductor devices, such as integrated circuits, maskless direct write may also be used to fabricate the semiconductor devices. Maskless direct write is a printing process in which charged particle beam lithography is used to transfer patterns to a substrate such as a semiconductor or silicon wafer to create the integrated circuit. Other substrates could include flat panel displays, imprint masks for nano-imprinting, or even reticles. Desired patterns of a layer are written directly on the surface, which in this case is also the substrate. Once the patterned layer is transferred the layer may undergo various other processes such as etching, ion-implantation (doping), metallization, oxidation, and polishing. These processes are employed to finish an individual layer in the substrate. If several layers are required, then the whole process or variations thereof will be repeated for each new layer. Some of the layers may be written using optical lithography while others may be written using maskless direct write to fabricate the same substrate. Eventually, a combination of multiples of devices or integrated circuits will be present on the substrate. These integrated circuits are then separated from one another by dicing or sawing and then mounted into individual packages. In the more general case, the patterns on the surface may be used to define artifacts such as display pixels or magnetic recording heads.

Two common types of charged particle beam lithography are variable shaped beam (VSB) and character projection (CP). These are both sub-categories of shaped beam charged particle beam lithography, in which a precise electron beam is shaped and steered so as to expose a resist-coated surface, such as the surface of a wafer or the surface of a reticle. In VSB, these shapes are simple shapes, usually limited to rectangles of certain minimum and maximum sizes and with sides which are parallel to the axes of a Cartesian coordinate plane, and triangles with their three internal angles being 45 degrees, 45 degrees, and 90 degrees of certain minimum and maximum sizes. At pre-determined locations, doses of electrons are shot into the resist with these simple shapes. The total writing time for this type of system increases with the number of shots. In CP charged particle beam lithography, there is a stencil in the system that has in it a variety of apertures or characters which may be rectilinear, arbitrary-angled linear, circular, nearly circular, annular, nearly annular, oval, nearly oval, partially circular, partially nearly circular, partially annular, partially nearly annular, partially nearly oval, or arbitrary curvilinear shapes, and which may be a connected set of complex shapes or a group of disjointed sets of a connected set of complex shapes. An electron beam can be shot through a character on the stencil to efficiently produce more complex patterns on the reticle. In theory, such a system can be faster than a VSB system because it can shoot more complex shapes with each time-consuming shot. Thus, an E-shaped pattern shot with a VSB system takes four shots, but the same E-shaped pattern can be shot with one shot with a character projection system. Note that VSB systems can be thought of as a special (simple) case of character projection, where the characters are just simple characters, usually rectangles or 45-45-90 triangles. It is also possible to partially expose a character. This can be done by, for instance, blocking part of the particle beam. For example, the E-shaped pattern described above can be partially exposed as an F-shaped pattern or an I-shaped pattern, where different parts of the beam are cut off by an aperture. This is the same mechanism as how various sized rectangles can be shot using VSB. In this disclosure, partial projection is used to mean both character projection and VSB projection.

As indicated, in optical lithography the lithographic mask or reticle comprises geometric patterns corresponding to the circuit components to be integrated onto a substrate. The patterns used to manufacture the reticle may be generated utilizing computer-aided design (CAD) software or programs. In designing the patterns the CAD program may follow a set of pre-determined design rules in order to create the reticle. These rules are set by processing, design, and end-use limitations. An example of an end-use limitation is defining the geometry of a transistor in a way in which it cannot sufficiently operate at the required supply voltage. In particular, design rules can define the space tolerance between circuit devices or interconnect lines. The design rules are, for example, used to ensure that the circuit devices or lines do not interact with one another in an undesirable manner. For example, the design rules are used so that lines do not get too close to each other in a way that may cause a short circuit. The design rule limitations reflect, among other things, the smallest dimensions that can be reliably fabricated. When referring to these small dimensions, one usually introduces the concept of a critical dimension. These are, for instance, defined as the smallest width of a line or the smallest space between two lines, those dimensions requiring exquisite control.

One goal in integrated circuit fabrication by optical lithography is to reproduce the original circuit design on the substrate by use of the reticle. Integrated circuit fabricators are always attempting to use the semiconductor wafer real estate as efficiently as possible. Engineers keep shrinking the size of the circuits to allow the integrated circuits to contain more circuit elements and to use less power. As the size of an integrated circuit critical dimension is reduced and its circuit density increases, the critical dimension of the circuit pattern or physical design approaches the resolution limit of the optical exposure tool used in optical lithography. As the critical dimensions of the circuit pattern become smaller and approach the resolution value of the exposure tool, the accurate transcription of the physical design to the actual circuit pattern developed on the resist layer becomes difficult. To further the use of optical lithography to transfer patterns having features that are smaller than the light wavelength used in the optical lithography process, a process known as optical proximity correction (OPC) has been developed. OPC alters the physical design to compensate for distortions caused by effects such as optical diffraction and the optical interaction of features with proximate features. OPC includes all resolution enhancement technologies performed with a reticle.

OPC may add sub-resolution lithographic features to mask patterns to reduce differences between the original physical design pattern, that is, the design, and the final transferred circuit pattern on the substrate. The sub-resolution lithographic features interact with the original patterns in the physical design and with each other and compensate for proximity effects to improve the final transferred circuit pattern. One feature that is used to improve the transfer of the pattern is a sub-resolution assist feature (SRAF). Another feature that is added to improve pattern transference is referred to as "serifs". Serifs are small features that can be positioned on a corner of a pattern to sharpen the corner in the final transferred image. It is often the case that the precision demanded of the surface manufacturing process for SRAFs are less than those for patterns that are intended to print on the substrate, often referred to as main features. Serifs are a part of a main feature. As the limits of optical lithography are being extended far into the sub-wavelength regime, the OPC features must be made more and more complex in order to compensate for even more subtle interactions and effects. As imaging systems are pushed closer to their limits, the ability to produce reticles with sufficiently fine OPC features becomes critical. Although adding serifs or other OPC features to a mask pattern is advantageous, it also substantially increases the total feature count in the mask pattern. For example, adding a serif to each of the corners of a square using conventional techniques adds eight more rectangles to a mask or reticle pattern. Adding OPC features is a very laborious task, requires costly computation time, and results in more expensive reticles. Not only are OPC patterns complex, but since optical proximity effects are long range compared to minimum line and space dimensions, the correct OPC patterns in a given location depend significantly on what other geometry is in the neighborhood. Thus, for instance, a line end will have different size serifs depending on what is near it on the reticle. This is even though the objective might be to produce exactly the same shape on the wafer. These slight but critical variations are important and have prevented others from being able to form reticle patterns. It is conventional to discuss the OPC-decorated patterns to be written on a reticle in terms of main features, that is features that reflect the design before OPC decoration, and OPC features, where OPC features might include serifs, jogs, and SRAF. To quantify what is meant by slight variations, a typical slight variation in OPC decoration from neighborhood to neighborhood might be 5% to 80% of a main feature size. Note that for clarity, variations in the design of the OPC are what is being referenced. Manufacturing variations, such as line-edge roughness and corner rounding, will also be present in the actual surface patterns. When these OPC variations produce substantially the same patterns on the wafer, what is meant is that the geometry on the wafer is targeted to be the same within a specified error, which depends on the details of the function that that geometry is designed to perform, e.g., a transistor or a wire. Nevertheless, typical specifications are in the 2%-50% of a main feature range. There are numerous manufacturing factors that also cause variations, but the OPC component of that overall error is often in the range listed. OPC shapes such as sub-resolution assist features are subject to various design rules, such as a rule based on the size of the smallest feature that can be transferred to the wafer using optical lithography. Other design rules may come from the mask manufacturing process or, if a character projection charged particle beam writing system is used to form the pattern on a reticle, from the stencil manufacturing process. It should also be noted that the accuracy requirement of the SRAF features on the mask may be lower than the accuracy requirements for the main features on the mask.

Inverse lithography technology (ILT) is one type of OPC technique. ILT is a process in which a pattern to be formed on a reticle is directly computed from a pattern which is desired to be formed on a substrate such as a silicon wafer. This may include simulating the optical lithography process in the reverse direction, using the desired pattern on the surface as input. ILT-computed reticle patterns may be purely curvilinear—i.e. completely non-rectilinear—and may include circular, nearly circular, annular, nearly annular, oval and/or nearly oval patterns. Since curvilinear patterns are difficult and expensive to form on a reticle using conventional techniques, rectilinear approximations of the curvilinear patterns may be used. In this disclosure ILT, OPC, source mask optimization (SMO), and computational lithography are terms that are used interchangeably.

There are a number of technologies used for forming patterns on a reticle, including using optical lithography or charged particle beam systems. Reticle writing for the most advanced technology nodes typically involves multiple passes of shaped charged particle beam writing, a process called multi-pass exposure, whereby the given shape on the reticle is written and overwritten. Typically, two to four passes are used to write a reticle to average out precision errors in the charged particle beam system, allowing the creation of more accurate photomasks. The total writing time for this type of system increases with the number of shots. A second type of system that can be used for forming patterns on a reticle is a character projection system, which has been described above.

Prior to VSB and CP shaped beam systems, a Gaussian beam, or spot beam, charged particle beam technology was used. These relatively inexpensive systems are still in use today for research and other uses. VSB systems write semiconductor reticles and wafers as much as two orders of magnitude faster than Gaussian beam systems. In Gaussian beam technology, an unshaped beam is projected onto the surface to expose the resist. The writing of the Gaussian beam is done in a vector-writing manner where the beam can be on while it is moving from one point to the next, drawing a line. Dosage is controlled in Gaussian beam technology by controlling the velocity of the beam. The thickness of the line, as registered by resist coating the surface, is therefore determined by the velocity of the movement of the Gaussian beam. In VSB and CP projection machines known in the art, a shaped electron beam 140 (see FIG. 1) is stationary relative to the surface 130 of a substrate 132 being written during each exposure period or "shot". Note that some VSB and CP projection machines are designed so that the surface 130 continually moves during the writing process, with the electron beam 140 also moving at a speed and direction equal to the continuous movement of the surface 130, the electron beam 140 thereby remaining stationary during a shot only with respect to the surface 130.

The cost of shaped beam charged particle beam lithography is directly related to the time required to expose a pattern on a surface, such as a reticle or wafer. Conventionally, the exposure time is related to the number of shots required to produce the pattern. For the most complex integrated circuit designs, forming the set of layer patterns on a set of reticles is a costly and time-consuming process. It would therefore be advantageous to be able to reduce the time required to form complex patterns, such as curvilinear patterns, on a reticle and other surfaces.

SUMMARY OF THE DISCLOSURE

A method and system for fracturing or mask data preparation or proximity effect correction is disclosed, wherein a shot determined for a shaped charged particle beam writer system comprises dragging the charged particle beam across a surface during the shot, so as to form a complex pattern in a single, extended shot. The dragging may be done with either variable shaped beam (VSB) or character projection (CP) shots. Methods for specifying in the shot data the path for the dragged shot are also disclosed. Other embodiments include using dragged shots with partial projection, varying the dragging velocity during a shot, and combining dragged shots with conventional shots.

A method and system for creating glyphs which contain dragged shots is also disclosed.

BRIEF DESCRIPTION OF THE DRAWINGS

FIG. 2A illustrates a pattern formed by an oval-shaped CP character;

FIG. 2B illustrates a pattern formed by a dragged shot using an oval-shaped CP character;

FIG. 3A illustrates an annular pattern formed by dragging a CP character in a circular path;

FIG. 3B illustrates a circular pattern formed by one dragged shot and one conventional square shot;

DETAILED DESCRIPTION OF THE EMBODIMENTS

The improvements and advantages of the present disclosure can be accomplished by use of a shaped beam charged particle beam writer system in which the beam can be moved or dragged during a shot over a specified path, and by creating and using a shot list which contains information with which to control the charged particle beam writer system in making the dragged shot.

Figure 1:
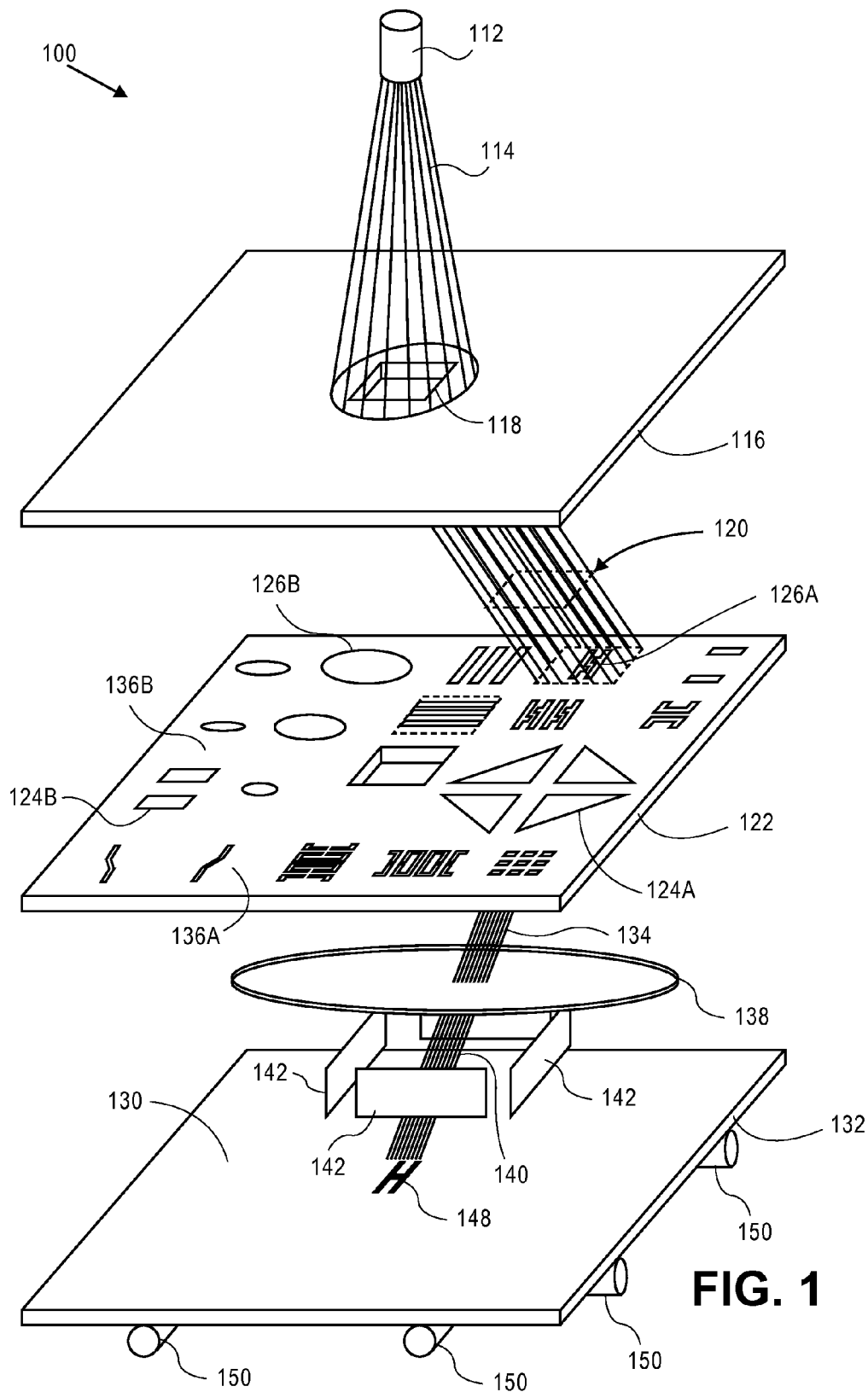
FIG. 1 illustrates a character projection charged particle beam system.

Referring now to the drawings, wherein like numbers refer to like items, FIG. 1 illustrates an embodiment of a conventional lithography system 100, such as a charged particle beam writer system, in this case an electron beam writer system, that employs character projection to manufacture a surface 130. The electron beam writer system 100 has an electron beam source 112 that projects an electron beam 114 toward an aperture plate 116. The plate 116 has an aperture 118 formed therein which allows the electron beam 114 to pass. Once the electron beam 114 passes through the aperture 118 it is directed or deflected by a system of lenses (not shown) as electron beam 120 toward another rectangular aperture plate or stencil mask 122. The stencil 122 has formed therein a number of openings or apertures 124 that define various types of characters 126. Each character 126 formed in the stencil 122 may be used to form a pattern 148 on a surface 130 of a substrate 132, such as a silicon wafer, a reticle or other substrate. In partial exposure, partial projection, partial character projection, or variable character projection, electron beam 120 may be positioned so as to strike or illuminate only a portion of one of the characters 126, thereby forming a pattern 148 that is a subset of character 126. For each character 126 that is smaller than the size of the electron beam 120 defined by aperture 118, a blanking area 136, containing no aperture, is designed to be adjacent to the character 126, so as to prevent the electron beam 120 from illuminating an unwanted character on stencil 122. An electron beam 134 emerges from one of the characters 126 and passes through an electromagnetic or electrostatic reduction lens 138 which reduces the size of the pattern from the character 126. In commonly available charged particle beam writer systems, the reduction factor is between 10 and 60. The reduced electron beam 140 emerges from the reduction lens 138, and is directed by a series of deflectors 142 onto the surface 130 as the pattern 148, which is depicted as being in the shape of the letter "H" corresponding to character 126a. The pattern 148 is reduced in size compared to the character 126 because of the reduction lens 138. The pattern 148 is drawn by using one shot of the electron beam system 100. This reduces the overall writing time to complete the pattern 148 as compared to using a variable shape beam (VSB) projection system or method. Although one aperture 118 is shown being formed in the plate 116, it is possible that there may be more than one aperture in the plate 116. Although two plates 116 and 122 are shown in this example, there may be only one plate or more than two plates, each plate comprising one or more apertures.

In conventional charged particle beam writer systems the reduction lens 138 is calibrated to provide a fixed reduction factor. The reduction lens 138 and/or the deflectors 142 also focus the beam on the plane of the surface 130. The size of the surface 130 may be significantly larger than the maximum beam deflection capability of the deflection plates 142. Because of this, patterns are normally written on the surface in a series of stripes. Each stripe contains a plurality of sub-fields, where a sub-field is within the beam deflection capability of the deflection plates 142. The electron beam writer system 100 contains a positioning mechanism 150 to allow positioning the substrate 132 for each of the stripes and sub-fields. In one variation of the conventional charged particle beam writer system, the substrate 132 is held stationary while a sub-field is exposed, after which the positioning mechanism 150 moves the substrate 132 to the next sub-field position. In another variation of the conventional charged particle beam writer system, the substrate 132 moves continuously during the writing process. In this variation involving continuous movement, in addition to deflection plates 142, there may be another set of deflection plates (not shown) to move the beam at the same speed and direction as the substrate 132 is moved.

The minimum size pattern that can be projected with reasonable accuracy onto a surface 130 is limited by a variety of short-range physical effects associated with the electron beam writer system 100 and with the surface 130, which normally comprises a resists coating on the substrate 132. These effects include forward scattering, Coulomb effect, and resist diffusion. Beam blur is a term used to include all of these short-range effects. The most modern electron beam writer systems can achieve an effective beam blur in the range of 20 nm to 30 nm. Forward scattering may constitute one quarter to one half of the total beam blur. Modern electron beam writer systems contain numerous mechanisms to reduce each of the constituent pieces of beam blur to a minimum. Some electron beam writer systems may allow the beam blur to be varied during the writing process, from the minimum value available on an electron beam writing system to one or more larger values.

Conventionally, in shaped beam systems, the deflector plates 142 are adjusted so that the position of the electron beam 140 on surface 130 is fixed relative to the surface 130 during a shot. In the present invention, the shaped electron beam writer system is novelly allowed to be controlled in such a way that the deflector plates 142 may move or "drag" the electron beam 140 relative to the surface 130 during a shot. The control of this dragging is through the shot data, in which a desired path that should be traversed by the electron beam is specified. The present invention includes allowing the velocity with which the electron beam 140 moves across the surface 130 to also be controlled by the shot data.

FIG. 2A illustrates an example of a pattern 202 that may be formed on a surface 130 with a conventional CP shot using an oval-shaped character. For use with FIG. 2B, point 204 is designated as the reference point of the pattern 202. FIG. 2B illustrates an example of a track 210 that may be formed using the same oval-shaped character by dragging the electron beam 140 across the surface 130 during a shot, according to this disclosure. The projected image at the start of the shot is shown by dashed outline 212. The reference point of the projected image is at position 214 at the start of the shot and traverses a straight line during the shot from position 214 to position 216. The velocity of the traversal is constant in this example. The dosage received by the surface 130 within track 210 varies both longitudinally—from left-to-right—and cross-sectionally from bottom to top. If the surface 130 is a resist-coated surface, the pattern registered by the resist may therefore not match the outline of track 210, depending on whether all parts of the track 210 receive a higher dosage than the threshold of the resist. The same track 210 may also be produced by dragging the reference point of the pattern in the reverse direction, from position 216 to position 214. When a multi-pass exposure procedure is being used, such as a two-pass exposure where one-half of the exposure is to be delivered in each pass, the electron beam may be dragged in one direction for half of the passes, and in the reverse direction for the other half of the passes.

FIG. 3A illustrates an example of an annular pattern 308 that may be formed on a resist-coated surface using a dragged shot of a circular character. The dashed outline 302 shows the image of the circular character projected onto the surface at the start of the shot. In this example, the center of the circular projected image is designated as the particle beam reference point. The center of the circular image is at position 304 at the start of the shot. During the dragged shot, the deflectors 142 control the electron beam 140 so that the center of the projected circular image traverses a full circle, moving in the direction shown by arc 306, and ending back at position 304. The velocity of the traversal is controlled so that the dosage received by the resist is appropriate to form the pattern 308 on the surface 130. As this example shows, the annular pattern 308 may be formed without requiring creation of an annular CP character. Additionally, the use of a dragged shot allows formation of the annular pattern 308 in cases where the pattern 308 is too large to be formed using a single CP shot. FIG. 3B illustrates an exemplary formation of a closed circle 312 by combining a dragged shot with a non-dragged shot. FIG. 3B shows the same annular pattern 308 that may be formed by dragging the image 302 of a circular character in a full circle. Additionally, FIG. 3B illustrates a square shot 310, such as a VSB shot, where the shot 310 causes the resist to register a pattern that completely covers the hole in the pattern 308. In FIG. 3B, the square shot 310 is illustrated with cross-hatching. The union of shot 310 and the dragged shot 308 forms the circular pattern with outline 312. This example illustrates how a relatively large circular pattern may be formed with a relatively small circular character, using one dragged shot and one conventional shot.

Figure 4:
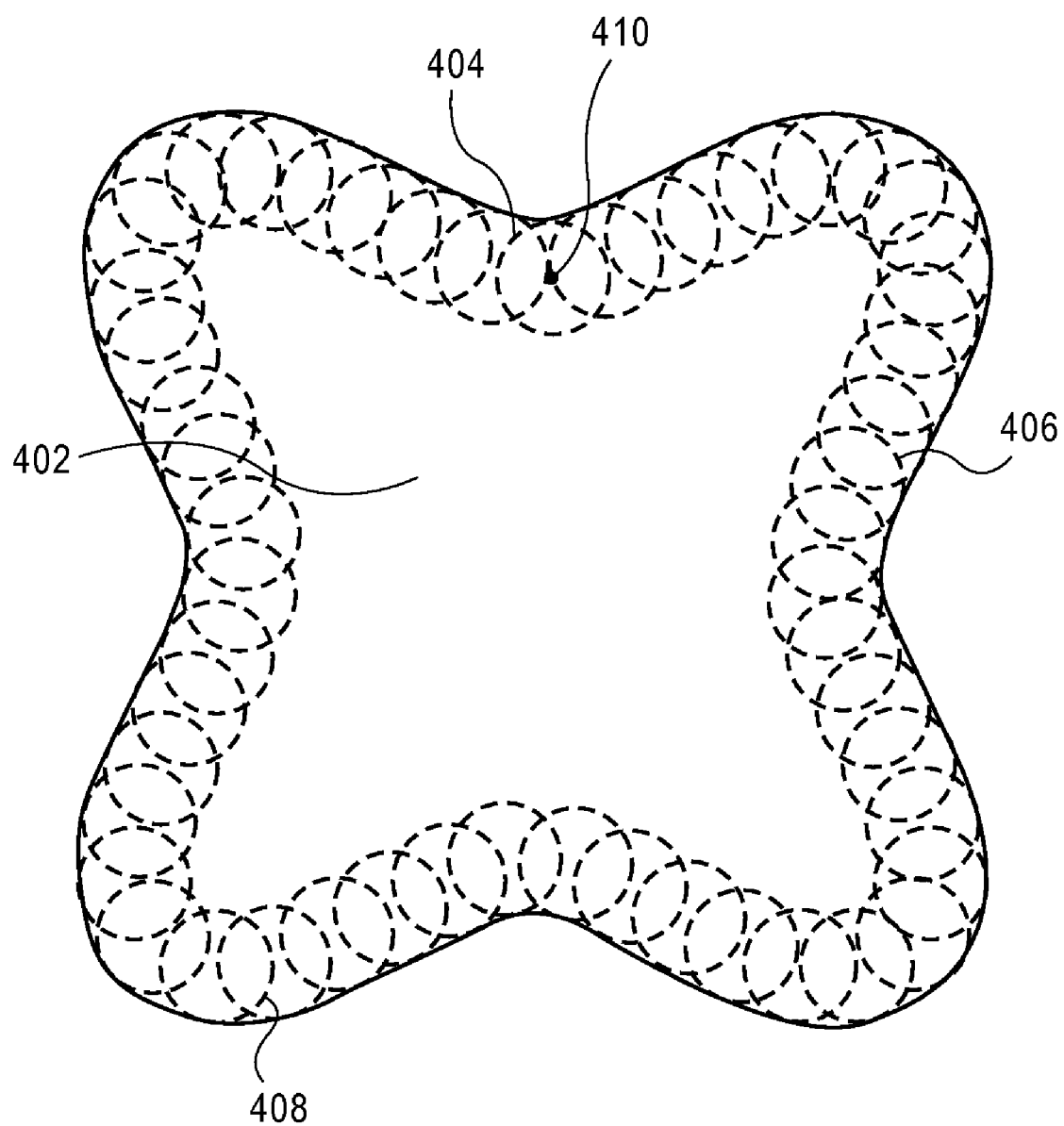
FIG. 4 illustrates how the perimeter of a curvilinear pattern may be formed by dragging a character in a curvilinear track.

FIG. 4 illustrates an example of how a CP character can be used to form the perimeter of a curvilinear pattern by using a dragged shot. Curvilinear pattern 402 is the desired pattern to be formed on a surface. The dashed outline circle 404 is the projected image of a circular CP character at the start of a dragged shot. The center of the circular pattern 410 is the designated reference point for the particle beam. The series of dashed outline circles, which includes 406 and 408 in addition to 404, is used to illustrate the position of the projected image at different points in time as the particle beam is dragged in a closed curvilinear path in which the second end point is coincident with the first end point 410. In this example, the shot information must contain a description of the curvilinear path that the particle beam must follow during the shot. The path may be represented by a mathematical expression, such as a linear spline, cubic spline, basis spline, or non-uniform rational basis spline. Additionally, the type and order of the mathematical expression may be assumed but not explicitly specified by the fracturing, mask data preparation, and PEC software, and by the charged particle beam writing system input software. For example, for a spline, the type and order of the spline may be assumed, and only the knot vector or extended knot vector, and, where applicable, the control points and weightings may be specified. In one embodiment, a linear spline may be assumed, and the track may be represented as a sequence of points which are the knot vector, where the points represent a sequence of connected line segments. In one embodiment, the perimeter of curvilinear pattern 402 may be formed using one or more dragged shots having a higher-than-minimum beam blur. The use of higher-than-minimum beam blur may allow formation of perimeter patterns using shots that require less time than shots using the conventional minimum-possible beam blur. In another embodiment, the perimeter of curvilinear pattern 402 may be formed using a dragged shot having a minimum beam blur, and the interior of pattern 402 may be formed using shots with a different beam blur, that is higher than minimum. As illustrated in FIG. 4, use of dragged shots with a circular character can be used to efficiently form the perimeters of complex curvilinear patterns.

Figure 5A:
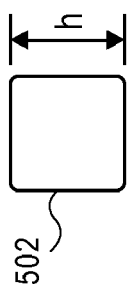
FIG. 5A illustrates a pattern formed conventionally by a square VSB shot.
Figure 5C:
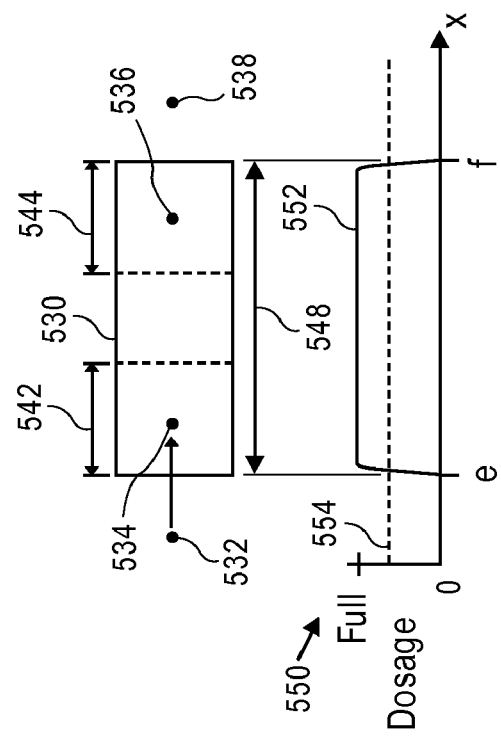
FIG. 5C illustrates an alternate method of forming a rectangular pattern by dragging a square VSB shot, in which all parts of the registered pattern receive a nearly constant dosage.
Figure 5B:
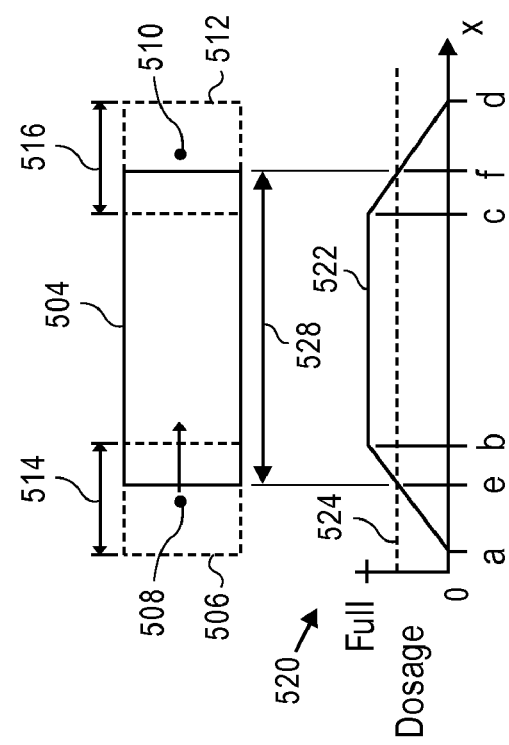
FIG. 5B illustrates a method of forming a rectangular pattern by dragging a square VSB shot.

FIGS. 5A-5C illustrate an example of how dragging can be used to form rectangular patterns on a resist-coated surface using dragged shots. In this example a VSB aperture is used. FIG. 5A illustrates a pattern 502 formed conventionally by a square VSB shot. FIG. 5B illustrates one method of forming a rectangular pattern 504 such as the pattern for a wire on an integrated circuit, using the same square VSB aperture used to form pattern 502, by using a dragged shot. In FIG. 5B the projected image at the beginning of the shot is shown by the dashed outlined area 506, which has a width 514. Point 508, which is at the center of the square, is the designated reference point. The reference point is dragged from point 508 to point 510 as the arrow near point 508 indicates. At the conclusion of the shot the projected image is shown by the dashed outlined area 512, which has a width 516 equal to 514. Dosage graph 520 shows the resulting longitudinal dosage profile 522, that is the dosage along the length of the shot in the direction of the dragging—which in this example is horizontal. As can be seen, between x-coordinates "a" and "b", the dosage rises from zero to a full or normal dosage. Similarly between x-coordinates "c" and "d" the dosage falls from full dosage to zero. This is due to the different exposure time that various areas of the surface receive between projected image 506 and projected image 512. Only between "b" and "c" is the dosage at the full dosage. The dosage graph 520 also shows the resist threshold 524, shown as a dashed line. Areas of the surface which receive a dosage higher than the resist threshold will register a pattern on the surface, while areas which receive a dosage lower than the resist threshold will register no pattern. Only between "e" and "f" is the dosage above the resist threshold 524. The length in the x-dimension of the pattern that is registered by the resist is therefore 528.

FIG. 5C illustrates an example of an alternative method for forming patterns in which the ends of the pattern do not receive a lower dosage than the middle of the pattern. This method uses partial projection. To form pattern 530, which is the same size as pattern 504, the particle beam begins the shot at point 532. At the beginning of the shot, however, the VSB aperture is illuminated so as to produce on the surface a pattern of height "h" and width zero—so initially no charged particles are reaching the surface. During the shot, the particle beam is dragged from point 532 to point 538. Immediately after the shot begins, the projected VSB pattern width is increased at the same rate as the particle beam moves, so that when the particle beam reference point reaches point 534, the width 542 of the projected image equals "h". The width of the projected image remains constant at "h" as the particle beam moves from point 534 to point 536. When the particle beam is at reference point 536, the projected image has width 544 which equals "h". When the particle beam passes point 536 the VSB aperture illumination is gradually changed to decrease the projected VSB pattern width, again at the same rate as the particle beam moves, so that when the particle beam reaches point 538, the width of the particle beam is zero. Dosage graph 550 shows the resulting longitudinal dosage profile 552. As can be seen, the slope of the dosage profile 552 in the vicinity of point "e" and point "f" is higher than the slope of the dosage profile 522 in the vicinity of point "e" and point "f". In the general case, to achieve proper illumination with a "target" VSB aperture such as a square, the beginning-of-shot particle beam position should be such that the pattern produced by the target VSB aperture abuts the edge of the pattern to be written, but with an aperture size of zero in the direction that the particle beam will travel. As the particle beam then moves, the size of the VSB-illuminated pattern increases at the same speed as the particle beam travels across the surface. Similarly, at the other side of the pattern, when the VSB-illuminated pattern reaches the edge of the desired pattern, the size of the VSB aperture is reduced at the same rate as the particle beam travels. The method illustrated in the FIG. 5C example may be preferred over the method illustrated in FIG. 5B because of the more constant dosage that the registered pattern area receives, and the much lower dosage that the adjacent non-pattern area receives. The partial projection method may also be used when using a CP character, illustrated in FIG. 9 below.

Figure 7:
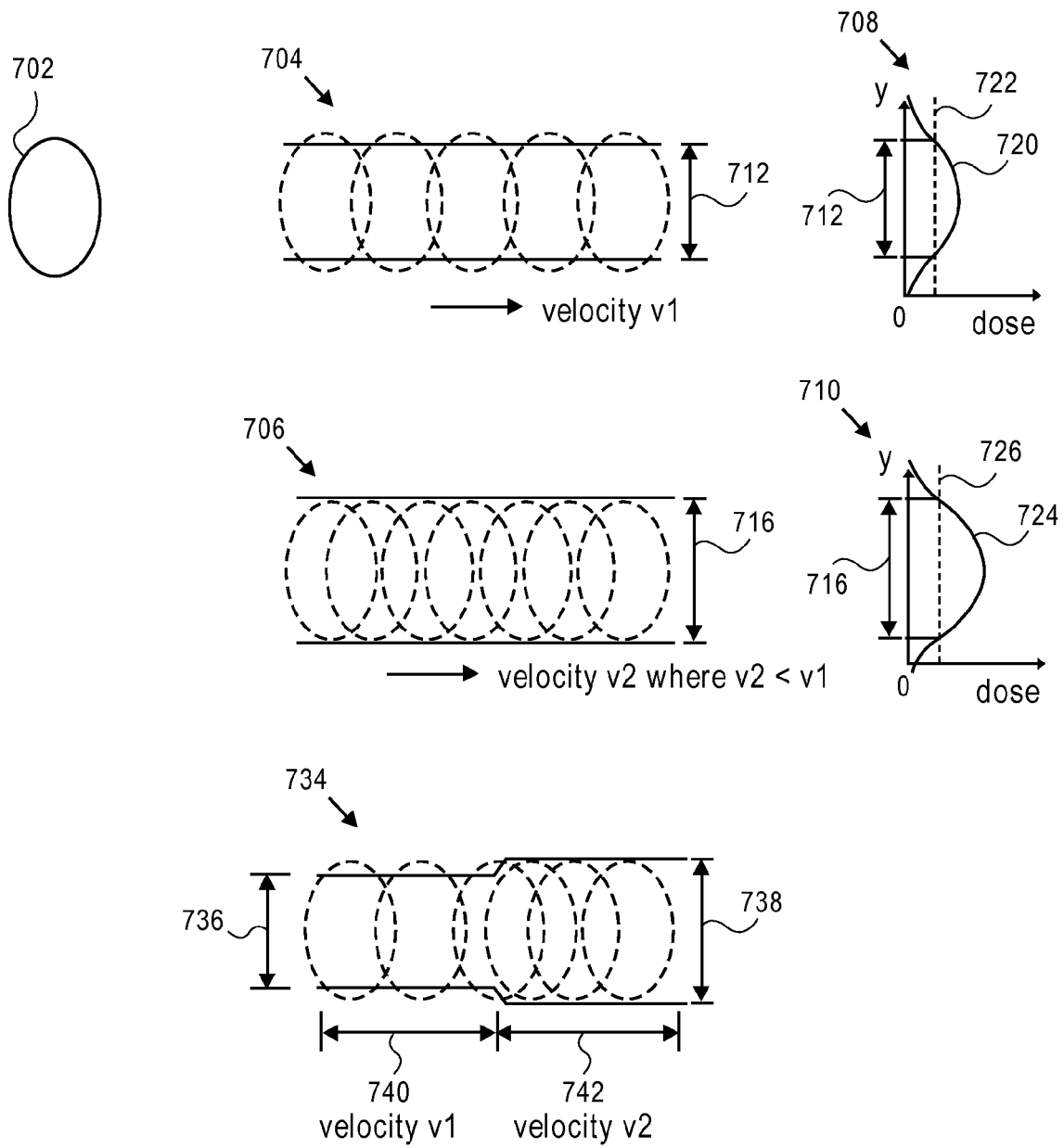
FIG. 7 illustrates the effects of varying the velocity of the particle beam on the track width.

FIG. 7 illustrates an example of how the velocity of the particle beam affects the dosage delivered to a resist-coated surface, and the width of the resulting pattern. In this example, a character is used which, if shot conventionally at a normal dosage, would form an oval pattern 702 on a surface. Track 704 illustrates the result of moving the particle beam 140 at a velocity "v1", where the repeated dashed line pattern indicates the particle beam motion. Track 704 is from a middle portion of a shot; the start of the shot and end of the shot are not illustrated. Graph 708 illustrates the dosage 720 along any vertical line or cross section through track 704. Also marked on graph 708 is the threshold 722 of the resist. A dosage greater than the threshold 722 causes a pattern to be registered on the surface, whereas a dosage less than the threshold causes no pattern to be registered. In this example the dosage curve 720 intersects the threshold 722 at points which are distance 712 apart. The width of the track 704 that will be registered by the resist is therefore 712, as is shown. Track 706 illustrates the result of moving the particle beam with the same size pattern 702 at a velocity "v2", where velocity "v2" is less than velocity "v1". As with track 704, only the middle part of a shot is shown. The spacing of the repeated dashed line pattern on track 706 is less than the spacing of the dashed line pattern on track 704, so as to illustrate that the particle beam velocity "v2" for track 706 is less than the velocity "v1" for track 704. Graph 710 illustrates the dosage 724 along any vertical line through track 706. Also shown on graph 710 is the resist threshold 726, where resist threshold 726 equals resist threshold 722. As can be seen, the dosage curve 724 intersects the threshold 726 at points which are distance 716 apart. The width of the track 706 that will be registered by the resist is therefore 716, as is shown. The width 716 of track 706 is greater than the width 712 of track 704, because the velocity "v2" used for track 706 results in a wider cross section 716 of pattern 706 receiving a greater than threshold dosage, compared to the cross section 712 of track 704 using velocity "v1". As is illustrated by graphs 708 and 710, dragging characters which have non-constant width in the direction in which the shot is being dragged—in this example the "x" direction—will produce varying cross-sectional dosages, where the cross section is in the direction perpendicular to the direction in which the shot is dragged—in this example the "y" direction. Characters such as circles or near circles, ellipses or near ellipses and ovals or near ovals will produce a varying cross-sectional dosage for any orientation of the character with respect to the direction of dragging. The varying dosage affects the width of the pattern registered by the resist. The width of the registered pattern can therefore be modified by changing the velocity of the charged particle beam. By changing the velocity of the charged particle beam, the width of the area receiving an exposure which is above the threshold of the resist may change. Additionally, by varying the velocity of the particle beam while a track is being exposed, a track with a varying width may be formed. Track 734 illustrates an example of a pattern that will be registered by the resist with a dragged shot which has a non-constant velocity. The portion 740 of track 734 is formed by dragging the shot at velocity "v1", which will register a track of width 736, where width 736 equals width 712. The portion 742 of track 734 is formed by dragging the shot at velocity "v2", which will register a track of width 738, where width 738 equals width 716. As can be seen, the lower velocity of the charged particle beam in the portion 742 of the shot results in a wider pattern being registered than is registered in portion 740 of the shot. When a non-constant shot velocity is desired, this must be specified in the shot information supplied to the charged particle beam writer system. The velocity may be specified as a mathematical expression, in a tabular format, or in some other way. In one embodiment, a linear spline may be used to specify the path of the shot, and a separate velocity may be specified for each line segment in the path—i.e. each point in the knot vector. In another embodiment, the velocity may be considered a third dimension to the path that the dragged shot traverses. The three dimensional path, including velocity, may be described by a mathematical expression, such as a spline. In yet another embodiment, a table of velocities may be specified, each velocity in the table corresponding to an x-coordinate or y-coordinate of the path, a time period, or some other variable.

Figure 9A:
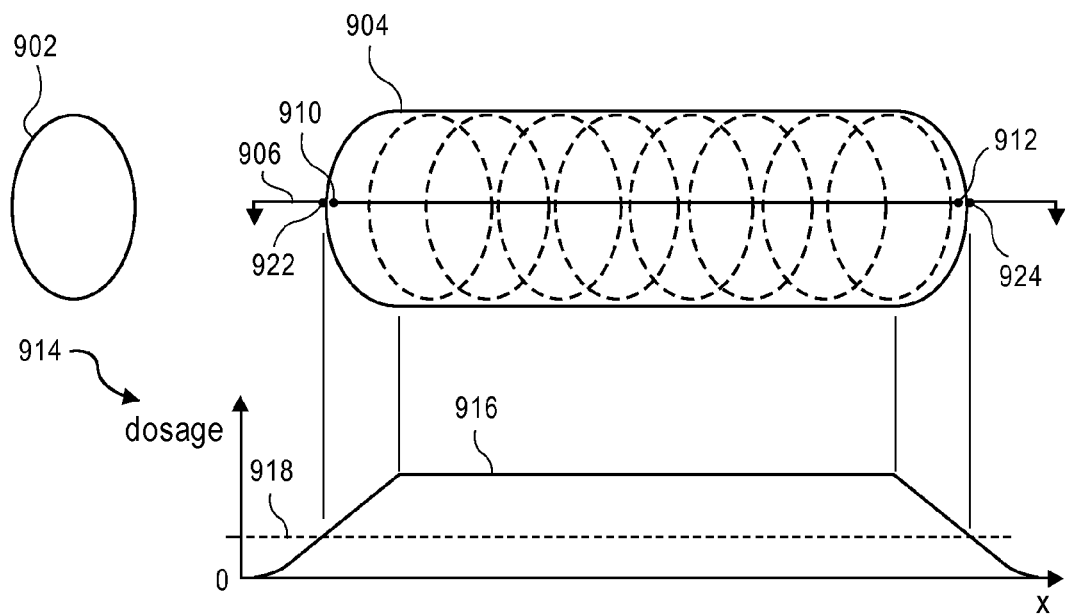
FIG. 9A illustrates formation of pattern by dragging an oval character.

FIG. 9A illustrates an example of how a pattern can be formed by dragging an oval character. A conventional character projection shot at normal dosage would form pattern 902 on a resist-coated surface. If the reference point of the pattern, which in this case is the center of the oval, is dragged from location 910 to location 912 at a constant speed, the pattern 904 may be registered by the resist. Dosage graph 914 shows the dosage along the measurement line 906. The dosage graph 914 shows that dosage 916 is received by the resist-coated surface. As can be seen, the dosage ramps up at the beginning of the shot and ramps down at the end of the shot. This ramping is due to the shorter time that the area at the beginning and the end of the shot are exposed to the charged particle beam, as analogous to FIG. 5B graph 520 using a square VSB shot. The resist threshold 918 is also shown on the dosage graph 914. As can be seen, the resist registers a pattern between points 922 and 924, which is where the registered pattern outline 904 intersects measurement line 906, and which corresponds to the portion of the dosage graph 916 where the dosage is above the resist threshold.

Figure 9B:
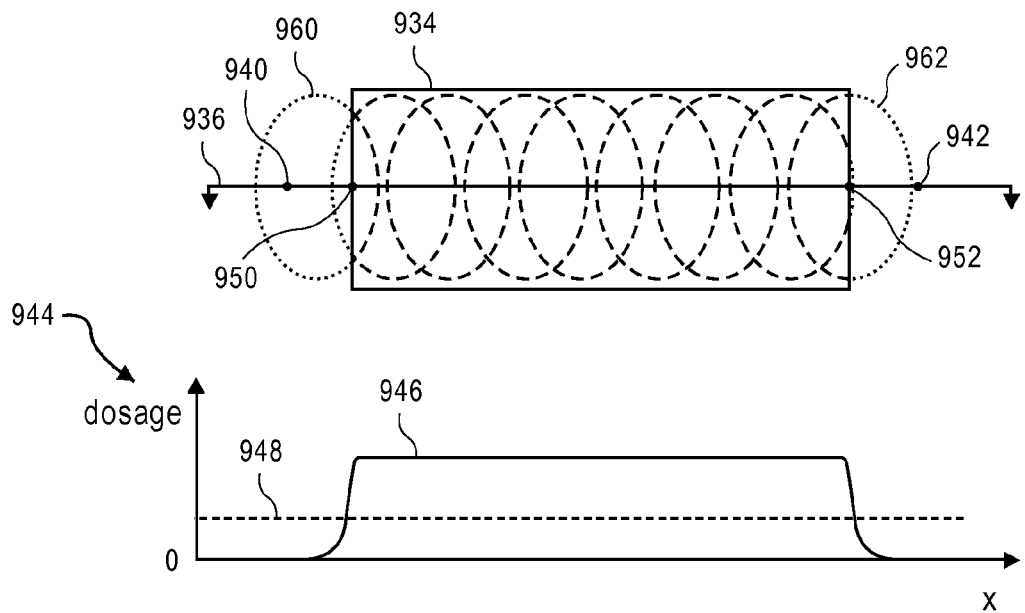
FIG. 9B illustrates forming a pattern similar to FIG. 9A, but using partial projection for the pattern ends.

FIG. 9B illustrates how partial projection can be used to create near-square pattern ends when drawing a pattern such as the pattern of FIG. 9A. In FIG. 9B, the charged particle beam, as referred to the center of the same oval character projection character used in the FIG. 9A example, is moved from location 940 to location 942. At the start of the shot, however, the charged particle beam 120 is positioned at the edge of the oval character, but so no part of the oval character is illuminated. Immediately after the dragged shot begins, the charged particle beam 120 is moved across the character stencil 122 at the same rate, in the scale of the surface image, as the particle beam 140 moves across the surface 130, resulting in dosage being delivered along the vertical line segment containing point 950. The repeated dashed line oval patterns indicate motion of the particle beam. The dotted line portions 960 and 962 indicate areas that do not receive dosage because that portion of the character on the stencil 122 is not illuminated due to the use of partial projection. Dosage graph 944 shows the dosage 946 received by the resist-coated surface along the measurement lint 936. As can be seen from dosage graph 944, the use of partial projection allows a much more abrupt change in dosage at the beginning and the end of the registered track than in dosage graph 914 without partial projection. As a result of the use of partial projection, a rectangular pattern 934 is registered on the resist-coated surface. Note that the dosage received by the resist-coated surface, although nearly constant between point 950 and point 952 (i.e., in the X-direction), is not constant from the bottom of the registered pattern to the top (i.e., in the Y-direction), as shown in FIG. 7 and described above. The use of partial projection in FIG. 9B is similar to the use of partial projection for a VSB shot as illustrated in the example of FIG. 5C and described above.

Figure 6A:
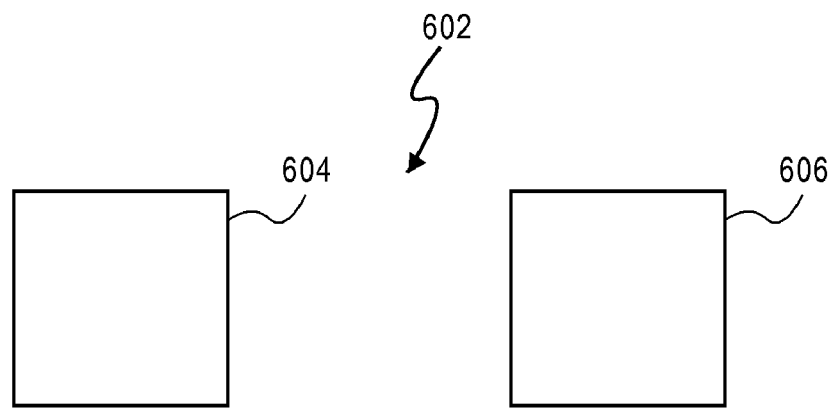
FIG. 6A illustrates a pattern comprising two squares, before OPC.
Figure 6B:
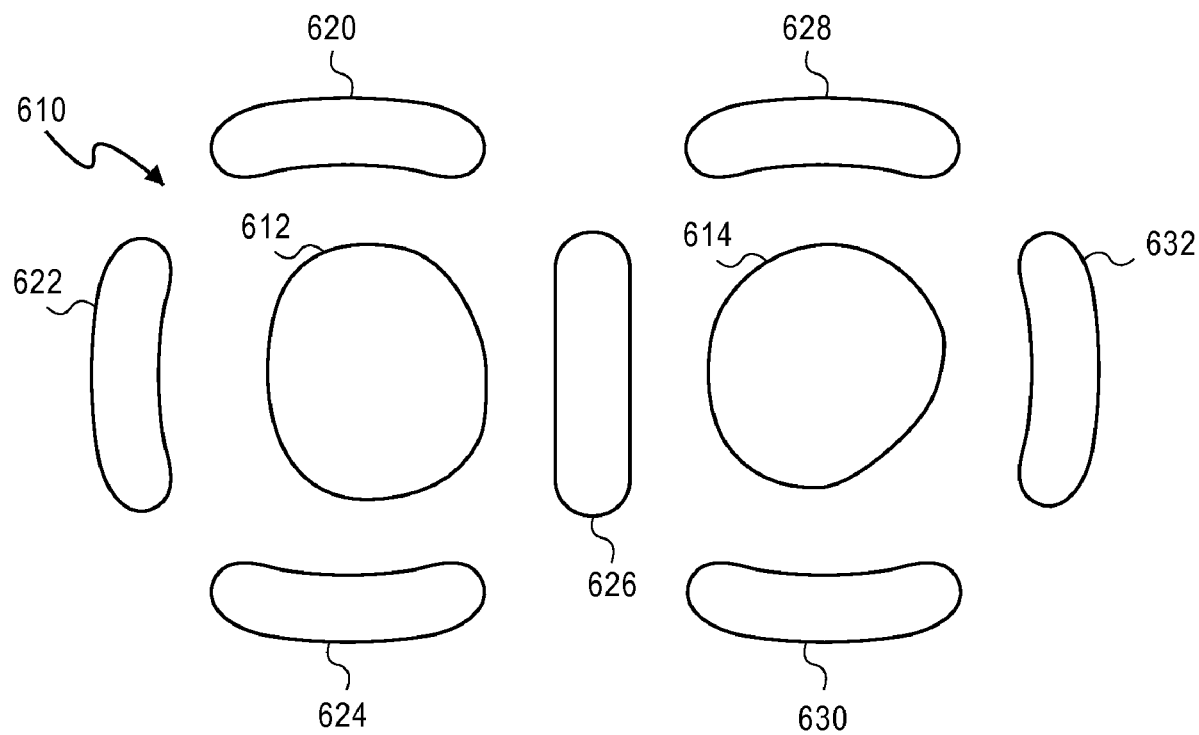
FIG. 6B illustrates a curvilinear pattern which may be produced by OPC processing of the pattern of FIG. 6A.
Figure 6C:
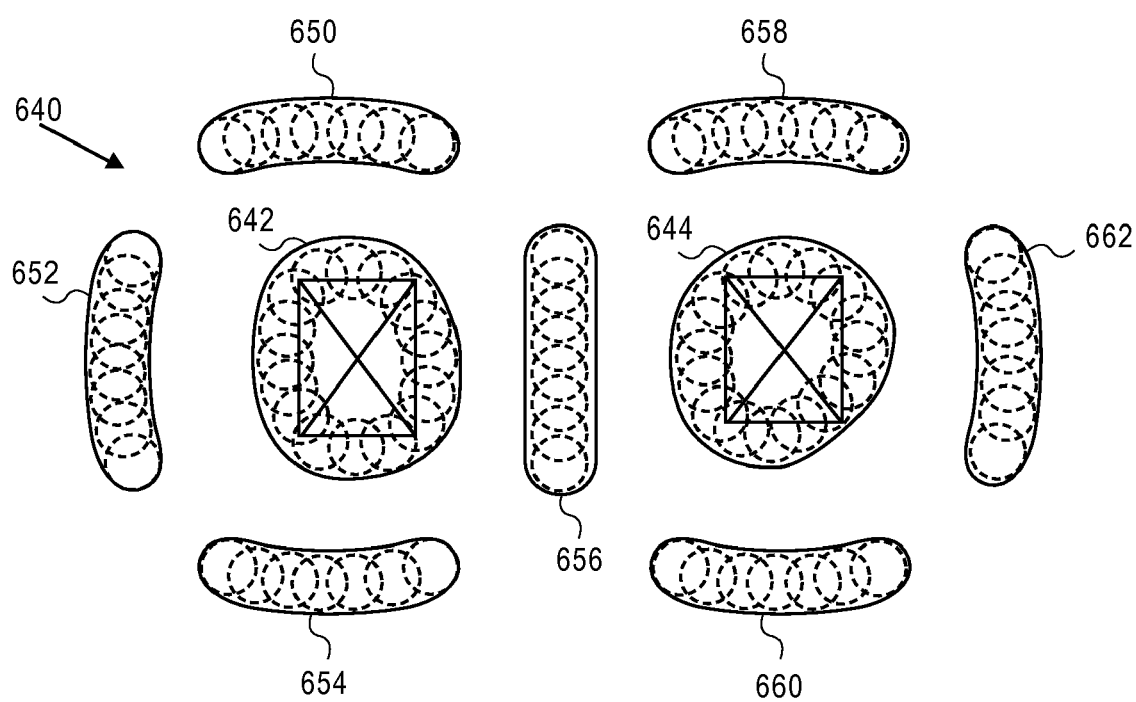
FIG. 6C illustrates an example of how most of the pattern of FIG. 6B may be formed by dragging a circular CP character.

FIG. 6A illustrates a pattern comprising two squares 604 and 606, such as may occur on contact or via layers of an integrated circuit design. FIG. 6B illustrates a curvilinear pattern 610 that may result from advanced OPC processing of the pattern of FIG. 6A. Pattern 610 is a desired pattern to be formed on a reticle. Pattern 610 is comprised of two main shapes: shape 612 and shape 614, and seven SRAF shapes: shape 620, shape 622, shape 624, shape 626, shape 628, shape 630 and shape 632. Forming a curvilinear pattern such as pattern 610 on a surface using conventional VSB or CP shots would require a large number of shots. FIG. 6C illustrates an example of how dragged shots can be used to form most of the FIG. 6B pattern 610. The pattern 640 of FIG. 6C comprises nine dragged shots of a circular CP character, and two VSB shots. Each dragged shot is illustrated by a repeated circular dashed line pattern. Each VSB shot is illustrated by an "X" in its interior. The main shapes, shape 642 and shape 644, are each formed by a dragged shot which defines the perimeter of the shape, and a single rectangular VSB shape to form the interior. The seven SRAF shapes, shape 650, shape 652, shape 654, shape 656, shape 658, shape 660, and shape 662, are each formed using a single dragged shot. Small variations in the width of each SRAF shape may be formed by varying the velocity of the particle beam during the shot. The diameter of the circular CP character used to expose pattern 640 is more critical for drawing the SRAFs than for drawing the perimeter of the main shapes 642 and 644. The choice of the CP character size is therefore best determined by the ranges of widths of the SRAF features. The set of shots which form pattern 640 illustrates how efficiently dragging can be used to form curvilinear patterns.

Figure 8:
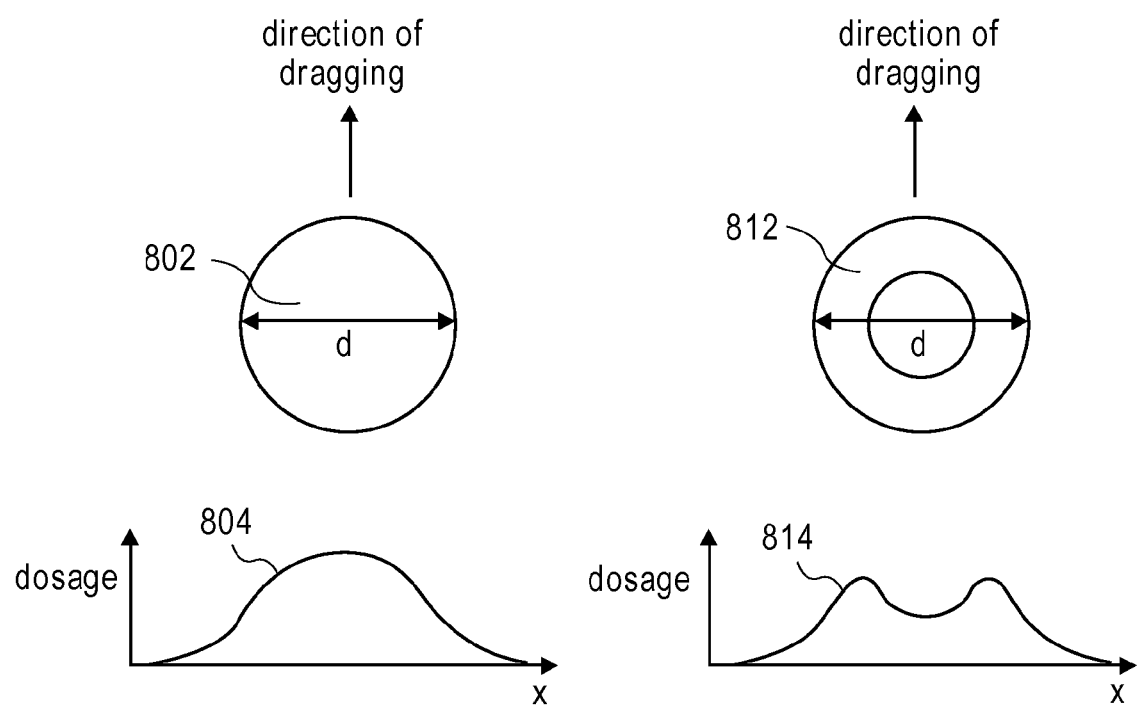
FIG. 8 illustrates a dosage comparison between a dragged circular character and a dragged annular character.

FIG. 8 illustrates a comparative example of the dosage using a circular and an annular character. Dragging the projected image 802 of a circular or nearly circular character in a vertical direction, as shown, may produce a cross-sectional dosage—i.e. a dosage along any horizontal line drawn through a track produced by the dragged projected image—as illustrated in dosage curve 804. Dragging the projected image 812 of an annular or nearly annular character 812 in a vertical direction, as shown, may produce a cross-sectional dosage curve 814. The diameter "d" of the circular projection image 802 equals the outside diameter "d" of the annular projected image 812. The same shot velocities are used for the circular character shot as for the annular character shot. The maximum dosage in the curve 814 from the annular dragged shot is lower than the maximum dosage in the curve 804 from the circular dragged shot. The lower maximum dosage may be desirable in situations where a maximum limit exists on the overall dosage that a resist-coated surface can receive. Additionally, the use of the annular character 812 may produce a lower Coulomb effect than use of a circular character of the same outside diameter. Similarly, dragging an oval-annular, nearly oval-annular, elliptically-annular, or nearly elliptically-annular character will result in a lower maximum cross-sectional dosage and may produce a lower Coulomb effect than dragging an oval, near oval, ellipse, or near ellipse respectively.

Figure 11A:
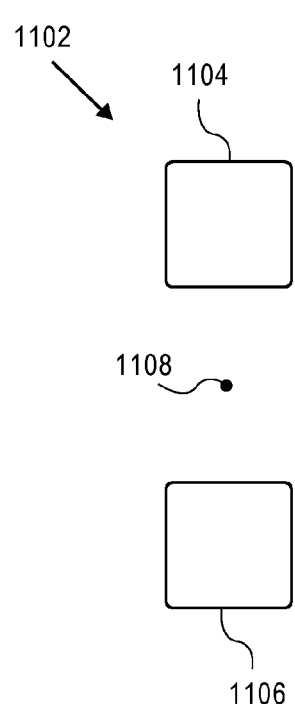
FIG. 11A illustrates an example of a pattern formed conventionally using a CP character comprising two square patterns.
Figure 11B:
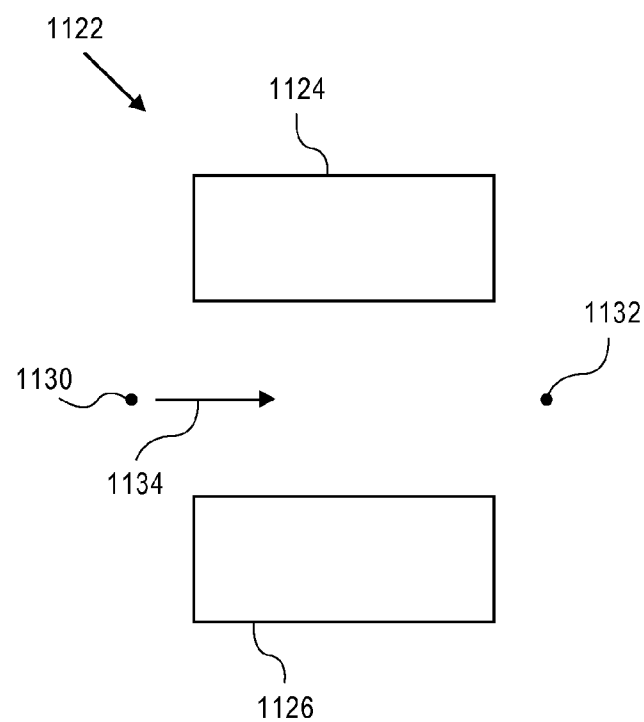
FIG. 11B illustrates an example of a pattern that may be formed with a dragged shot using a CP character comprising two square patterns.

FIGS. 11A&B illustrate an example of a dragged shot using a CP character comprising multiple disjoint patterns. FIG. 11A illustrates an example of a pattern 1102 which may be formed on a surface in a single conventional shot using a CP character containing two disjoint square patterns. Pattern 1102 comprises square 1104 and square 1106. The reference point for the pattern is point 1108. FIG. 11B illustrates a pattern 1122 that may be formed with a dragged shot using the same character as used for pattern 1102. Pattern 1122 comprises rectangle 1124 and rectangle 1126. The dragged shot comprises dragging the reference point 1108 from a first end point 1130 to a second end point 1132 in a straight path, in the direction of arrow 1134. The location of end points 1130 and 1132 reflect the use of partial projection to form pattern 1122, as in FIG. 5C. Although in the example of FIG. 11B, a CP character comprising square patterns is used in the dragged shot, CP characters comprising rectangular or curvilinear patterns may also be used. As illustrated in FIG. 11B, the use of dragged shots which have straight or nearly straight paths, using a character comprising a plurality of disjoint patterns, may be an efficient method of forming on a surface a plurality of parallel patterns, such as are found on wiring layers of integrated circuit designs. A character with a plurality of disjoint patterns may also be used in a dragged shot which has a curvilinear path to produce a plurality of tracks which are not parallel, where some or all of the tracks may intersect.

The dosage that would be received by a surface can be calculated and stored as a two-dimensional (X and Y) dosage map called a glyph. A two-dimensional dosage map or glyph is a two-dimensional grid of calculated dosage values for the vicinity of the shots comprising the glyph. This dosage map or glyph can be stored in a library of glyphs. The glyph library can be used as input during fracturing of the patterns in a design. For example, referring again to FIG. 3B, a dosage map may be calculated from the dragged circular CP shot and the VSB shot, and stored in the glyph library. If during fracturing, one of the input patterns is a circle of the same size as circular pattern 312, the glyph for circular pattern 312 and the two shots comprising the glyph may be retrieved from the library, avoiding the computational effort of determining an appropriate set of shots to form the circular input pattern. A series of glyphs may also be combined to create a parameterized glyph. Parameters may be discrete or may be continuous. For example, the shots and dosage maps for forming circular patterns such as circular pattern 312 may be calculated for a plurality of pattern diameters, and the plurality of resulting glyphs may be combined to form a discrete parameterized glyph. In another example, a pattern width may be parameterized as a function of dragged shot velocity.

Figure 10:
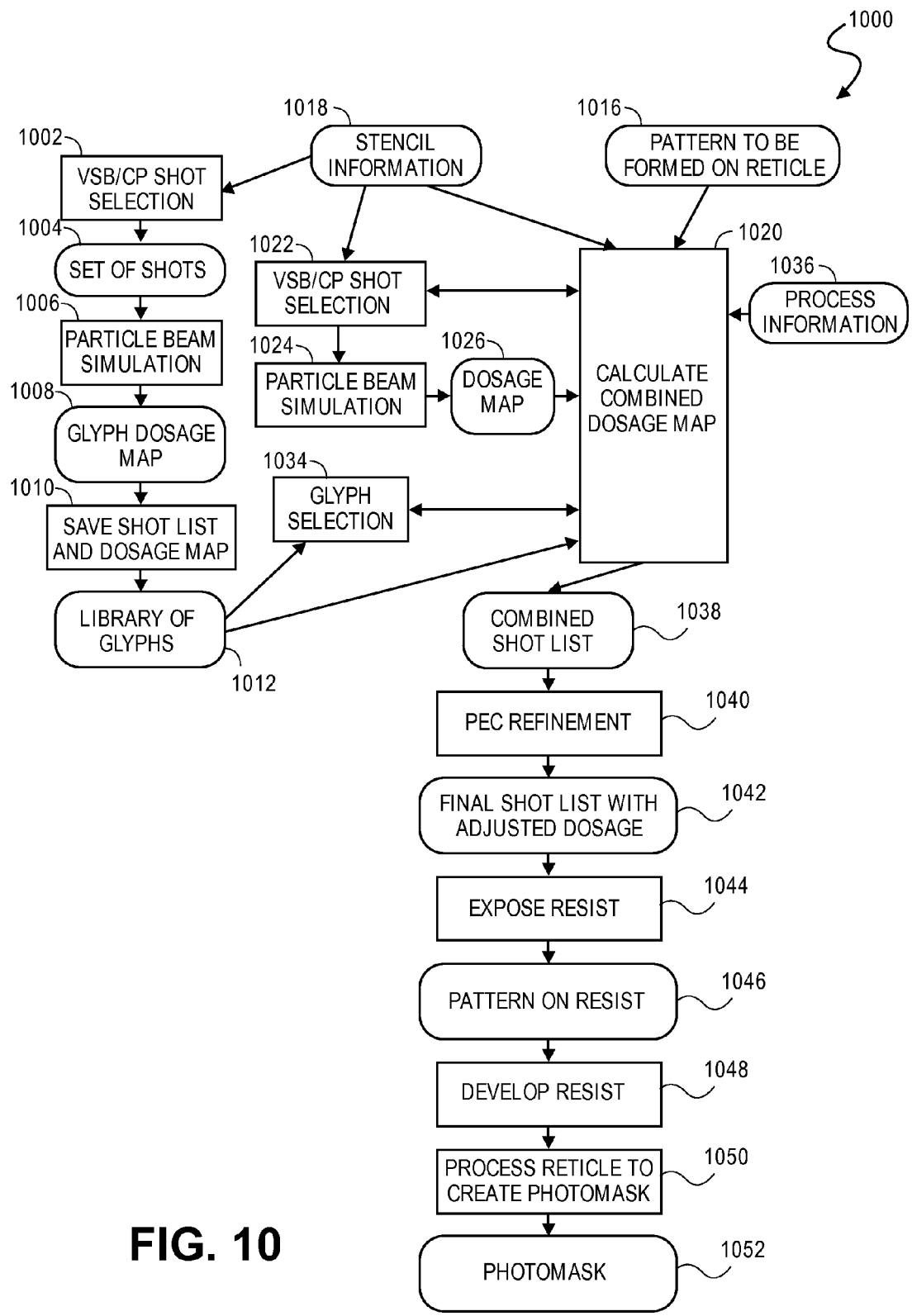
FIG. 10 illustrates a conceptual flow diagram of manufacturing a reticle and photomask using an exemplary method of the current disclosure.

FIG. 10 illustrates an exemplary conceptual flow diagram 1000 of a method for manufacturing a photomask according to the current disclosure. There are three types of input data to the process: stencil information 1018, which is information about the CP characters on the stencil of the charged particle beam system; process information 1036, which includes information such as the resist dosage threshold above which the resist will register a pattern; and a computer representation of the desired pattern 1016 to be formed on the reticle. In addition, initial optional steps 1002-1012 involve the creation of a library of glyphs. The first step in the optional creation of a library of glyphs is VSB/CP shot selection 1002, in which one or more VSB or CP shots, each shot with a specific dosage, are combined to create a set of shots 1004. The set of shots 1004 may include overlapping VSB shots and/or overlapping CP shots. The set of shots 1004 may also include dragged VSB and/or CP shots. For dragged shots, a shot path must be specified. Additionally, for dragged shots the dosage may be expressed as a charged particle beam velocity. Shots in the set of shots may also have a beam blur specified. The VSB/CP shot selection step 1002 uses the stencil information 1018, which includes information about the CP characters that are available on the stencil. The set of shots 1004 is simulated in step 1006 using charged particle beam simulation to create a dosage map 1008 of the set of shots. Step 1006 may include simulation of various physical phenomena including forward scattering, resist diffusion, Coulomb effect, etching, fogging, loading, resist charging, and backward scattering. The result of step 1006 is a two-dimensional dosage map 1008 which represents the combined dosage from the set of shots 1004 at each of the grid positions in the map. The dosage map 1008 is called a glyph. In step 1010 the information about each of the shots in the set of shots, and the dosage map 1008 of this additional glyph is stored a library of glyphs 1012. In one embodiment, a set of glyphs may be combined into a type of glyph called a parameterized glyph.

The required portion of the flow 1000 involves creation of a photomask. In step 1020 a combined dosage map for the reticle or reticle portion is calculated. Step 1020 uses as input the desired pattern 1016 to be formed on the reticle, the process information 1036, the stencil information 1018, and the glyph library 1012 if a glyph library has been created. In step 1020 an initial reticle dosage map may be created, into which the shot dosage maps will be combined. Initially, the reticle dosage map contains no shot dosage map information. In one embodiment, the grid squares of the reticle dosage map may be initialized with an estimated correction for long-range effects such as backscattering, fogging, or loading, a term which refers to the effects of localized resist developer depletion. Step 1020 may involve VSB/CP shot selection 1022, or glyph selection 1034, or both of these. Dragged VSB and/or CP shots may be selected in shot selection 1022. If a VSB or CP shot is selected, the shot is simulated using charged particle beam simulation in step 1024 and a dosage map 1026 of the shot is created. The charged particle beam simulation may comprise convolving a shape with a Gaussian. The convolution may be with a binary function of the shape, where the binary function determines whether a point is inside or outside the shape. The shape may be an aperture shape or multiple aperture shapes, or a slight modification thereof. In one embodiment, this simulation may include looking up the results of a previous simulation of the same shot, such as when using a temporary shot dosage map cache. A higher-than-minimum beam blur may be specified for the VSB or CP shot. For dragged shots, the shot path must be specified. Additionally, for dragged shots the dosage may be expressed as a charged particle beam velocity. Both VSB and CP shots may be allowed to overlap, and may have varying dosages with respect to each other. If a glyph is selected, the dosage map of the glyph is input from the glyph library. In step 1020, the various dosage maps of the shots and/or glyphs are combined into the reticle dosage map. In one embodiment, the combination is done by adding the dosages. Using the resulting combined dosage map and the process information 1036 containing resist characteristics, a reticle pattern may be calculated. If the reticle image matches the desired pattern 1016 within a pre-determined tolerance, then a combined shot list 1038 is output, containing the determined VSB/CP shots and the shots constituting the selected glyphs. If the calculated reticle image does not match the target image 1016 within a predetermined tolerance as calculated in step 1020, the set of selected CP shots, VSB shots and/or glyphs is revised, the dosage maps are recalculated, and the reticle pattern is recalculated. In one embodiment, the initial set of shots and/or glyphs may be determined in a correct-by-construction method, so that no shot or glyph modifications are required. In another embodiment, step 1020 includes an optimization technique so as to minimize either the total number of shots represented by the selected VSB/CP shots and glyphs, or the total charged particle beam writing time, or some other parameter. In yet another embodiment, VSB/CP shot selection 1022 and glyph selection 1034 are performed so as to generate multiple sets of shots, each of which can form a reticle image that matches the desired pattern 1016, but at a lower-than-normal dosage, to support multi-pass writing.

The combined shot list 1038 comprises the determined list of selected VSB shots, selected CP shots and shots constituting the selected glyphs. All the shots in the final shot list 1038 include dosage information. For dragged shots the dosage may be expressed as a velocity. All dragged shots in the final shot list also include path information. Shots may also include a beam blur specification. In step 1040, proximity effect correction (PEC) and/or other corrections may be performed or corrections may be refined from earlier estimates. For dragged shots, PEC may involve adjusting the velocity of the dragged shot, which adjusts the dosage on the surface. Thus, step 1040 uses the combined shot list 1038 as input and produces a final shot list 1042 in which the shot dosages, including the shot velocities for dragged shots, have been adjusted. The group of steps from step 1020 through step 1042, or subsets of this group of steps, are collectively called fracturing or mask data preparation. The final shot list 1042 is used by the charged particle beam system in step 1044 to expose resist with which the reticle has been coated, thereby forming a pattern 1046 on the resist. In step 1048 the resist is developed. Through further processing steps 1050 the reticle is transformed into a photomask 1052.

The fracturing, mask data preparation, proximity effect correction and glyph creation flows described in this disclosure may be implemented using general-purpose computers with appropriate computer software as computation devices. Due to the large amount of calculations required, multiple computers or processor cores may also be used in parallel. In one embodiment, the computations may be subdivided into a plurality of 2-dimensional geometric regions for one or more computation-intensive steps in the flow, to support parallel processing. In another embodiment, a special-purpose hardware device, either used singly or in multiples, may be used to perform the computations of one or more steps with greater speed than using general-purpose computers or processor cores. In one embodiment, the optimization and simulation processes described in this disclosure may include iterative processes of revising and recalculating possible solutions, so as to minimize either the total number of shots, or the total charged particle beam writing time, or some other parameter. In another embodiment, an initial set of shots may be determined in a correct-by-construction method, so that no shot modifications are required.

As set forth above, the path to be followed by the particle beam in a dragged shot may be expressed in a shot list as a mathematical expression. For both the fracturing operation and within the charged particle beam system, the mathematical expression may be evaluated directly. Alternatively, computer techniques such as a table look-up technique may be used. These techniques may allow faster evaluation of the expression than direct evaluation.

While the specification has been described in detail with respect to specific embodiments, it will be appreciated that those skilled in the art, upon attaining an understanding of the foregoing, may readily conceive of alterations to, variations of, and equivalents to these embodiments. These and other modifications and variations to the present methods for fracturing, creating glyphs, manufacturing a surface, and manufacturing an integrated circuit may be practiced by those of ordinary skill in the art, without departing from the spirit and scope of the present subject matter, which is more particularly set forth in the appended claims. Furthermore, those of ordinary skill in the art will appreciate that the foregoing description is by way of example only, and is not intended to be limiting. Steps can be added to, taken from or modified from the steps in this specification without deviating from the scope of the invention. In general, any flowcharts presented are only intended to indicate one possible sequence of basic operations to achieve a function, and many variations are possible. Thus, it is intended that the present subject matter covers such modifications and variations as come within the scope of the appended claims and their equivalents.

What is claimed is:

1. A method for fracturing or mask data preparation or proximity effect correction for shaped beam charged particle beam lithography comprising:
   inputting a set of patterns to be formed on a surface;
   determining a set of shots which can form the set of patterns on the surface, the set of shots comprising a dragged shot, wherein a charged particle beam is dragged from a first end point to a second end point during the dragged shot; and
   outputting the set of shots.

2. The method of claim 1 further comprising inputting a set of available character projection (CP) characters on a stencil, and wherein the dragged shot uses a CP character.

3. The method of claim 2 wherein a CP character on the stencil comprises one or more circular or nearly-circular patterns.

4. The method of claim 2 wherein a CP character on the stencil comprises one or more elliptical, nearly-elliptical, oval, nearly-oval, annular, nearly-annular, oval-annular, nearly oval-annular, elliptically-annular or nearly elliptically-annular patterns.

5. The method of claim 2 wherein the dragged shot uses a CP character comprising a plurality of disjoint patterns, and wherein the dragged shot thereby forms a plurality of tracks on the surface.

6. The method of claim 1 wherein the dragged shot can be used to form all or a portion of a curvilinear pattern in the set of patterns.

7. The method of claim 1 wherein the second end point is coincident with the first end point.

8. The method of claim 1 wherein the dragged shot can form the perimeter or a portion of the perimeter of a pattern in the set of patterns.

9. The method of claim 1 wherein the step of determining a set of shots comprises determining a beam blur radius for at least one shot in the set of shots, and wherein the step of outputting the set of shots comprises outputting beam blur radius information for at least one shot in the set of shots.

10. The method of claim 1 wherein the dragged charged particle beam follows a path described by a mathematical expression.

11. The method of claim 1 wherein the dragged charged particle beam follows a path described by a set of points representing a sequence of connected line segments.

12. The method of claim 1 wherein the step of determining further comprises minimizing the time required to form the pattern on the surface, while achieving a pre-determined pattern accuracy on the surface.

13. The method of claim 1 wherein the dragged shot comprises a longitudinal dosage profile, and wherein partial projection is used to increase the slope of the longitudinal dosage profile near the first and second endpoints.

14. The method of claim 1 wherein the set of shots further comprises a multi-pass exposure in which the particle beam is dragged from the second endpoint to the first endpoint in a second writing pass.

15. The method of claim 1 wherein the step of determining comprises using charged particle beam simulation.

16. The method of claim 15 wherein the charged particle beam simulation includes at least one of the group consisting of forward scattering, backward scattering, resist diffusion, coulomb effect, etching, fogging, loading and resist charging.

17. The method of claim 1 further comprising the step of inputting a set of glyphs, wherein at least one glyph in the set of glyphs comprises a dragged shot.

18. The method of claim 1 wherein each shot in the set of shots comprises a dosage, and wherein the dosage of the dragged shot is expressed as a velocity of the dragged charged particle beam.

19. The method of claim 18 wherein the dragged shot can form a track having a width on the surface, and wherein the velocity of the shot is determined so that the width of the track can form the pattern on the surface within a pre-determined tolerance.

20. The method of claim 18 wherein the velocity of the dragged shot is adjusted to accomplish proximity effect correction.

21. A method for creating glyphs comprising calculating a two-dimensional dosage map from one or more shots to create a glyph, wherein the dosage map comprises a charged particle beam dosage for each of a plurality of sample points, and wherein at least one of the shots comprises dragging a shaped beam charged particle beam between a first end point and a second end point.

22. The method of claim 21 wherein the glyphs are parameterized glyphs.

23. A system for fracturing or mask data preparation or proximity effect correction for use with shaped beam charged particle beam lithography comprising:
an input device capable of receiving a set of patterns to be formed on a surface;
a computation device capable of determining a set of shots that can be used to form the set of patterns, wherein a shot may comprise dragging the charged particle beam from a first end point to a second end point during the shot; and
an output device capable of outputting the determined set of shots.

24. The system of claim 23 wherein the computation device can perform the proximity effect correction for dragged shots by adjusting the charged particle beam velocity for the shot.

25. A system for creating glyphs comprising:
a computation device capable of calculating a two-dimensional dosage map from one or more shots to create a glyph, wherein the dosage map comprises a charged particle beam dosage for each of a plurality of sample points, and wherein at least one of the shots comprises dragging a shaped beam charged particle beam between a first end point and a second end point; and
a storage device capable of storing the glyph.

* * * * *